United States Patent
Heng et al.

(10) Patent No.: US 7,674,657 B2
(45) Date of Patent: Mar. 9, 2010

(54) METHOD OF MANUFACTURE OF ENCAPSULATED PACKAGE

(75) Inventors: Chai Wei Heng, Melaka (MY); Yang Hong Heng, Johor (MY); Yong Chern Poh, Johor (MY)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 12/046,969

(22) Filed: Mar. 12, 2008

(65) Prior Publication Data

US 2008/0157433 A1 Jul. 3, 2008

Related U.S. Application Data

(63) Continuation of application No. PCT/SG2005/000368, filed on Oct. 25, 2005.

(51) Int. Cl.
*H01L 21/00* (2006.01)
*H01L 23/28* (2006.01)
(52) U.S. Cl. .............. 438/127; 438/124; 438/126; 257/787; 257/670; 257/E23.131; 257/E23.116; 257/E21.502
(58) Field of Classification Search ............. 438/127; 257/787
See application file for complete search history.

(56) References Cited

U.S. PATENT DOCUMENTS

| 3,882,807 A | 5/1975 | Montgomery |
| 4,507,675 A | 3/1985 | Fujii et al. |
| 5,966,799 A | 10/1999 | Understiller et al. |
| 6,605,864 B2 | 8/2003 | Kahlisch et al. |

FOREIGN PATENT DOCUMENTS

| DE | 100 34 018 A1 | 1/2002 |
| EP | 0 817 265 A1 | 1/1998 |
| JP | 2000-200797 | 7/2000 |

OTHER PUBLICATIONS

Package Dimensions, 2SK3155, Jan. 2001.
NEC, NPN Silicon Power Transistor, 2SC3572, date unknown.

*Primary Examiner*—David A Zarneke
(74) *Attorney, Agent, or Firm*—Slater & Matsil, L.L.P.

(57) ABSTRACT

There is provided a method of making an encapsulated component package, including providing a support for supporting the components of the package during encapsulation, the support including legs extending beyond the perimeter of the final package, rupturing the support legs, and covering the exposed ends of the legs with an insulating material. There is also provided a package formed in accordance with the method.

15 Claims, 5 Drawing Sheets

The position at which the exposed metal fractures

After tab pull

Curved shape formed

After tab pull

Curved shape formed

After tab pull

Electrically insulating filling material

Filling done at an angle

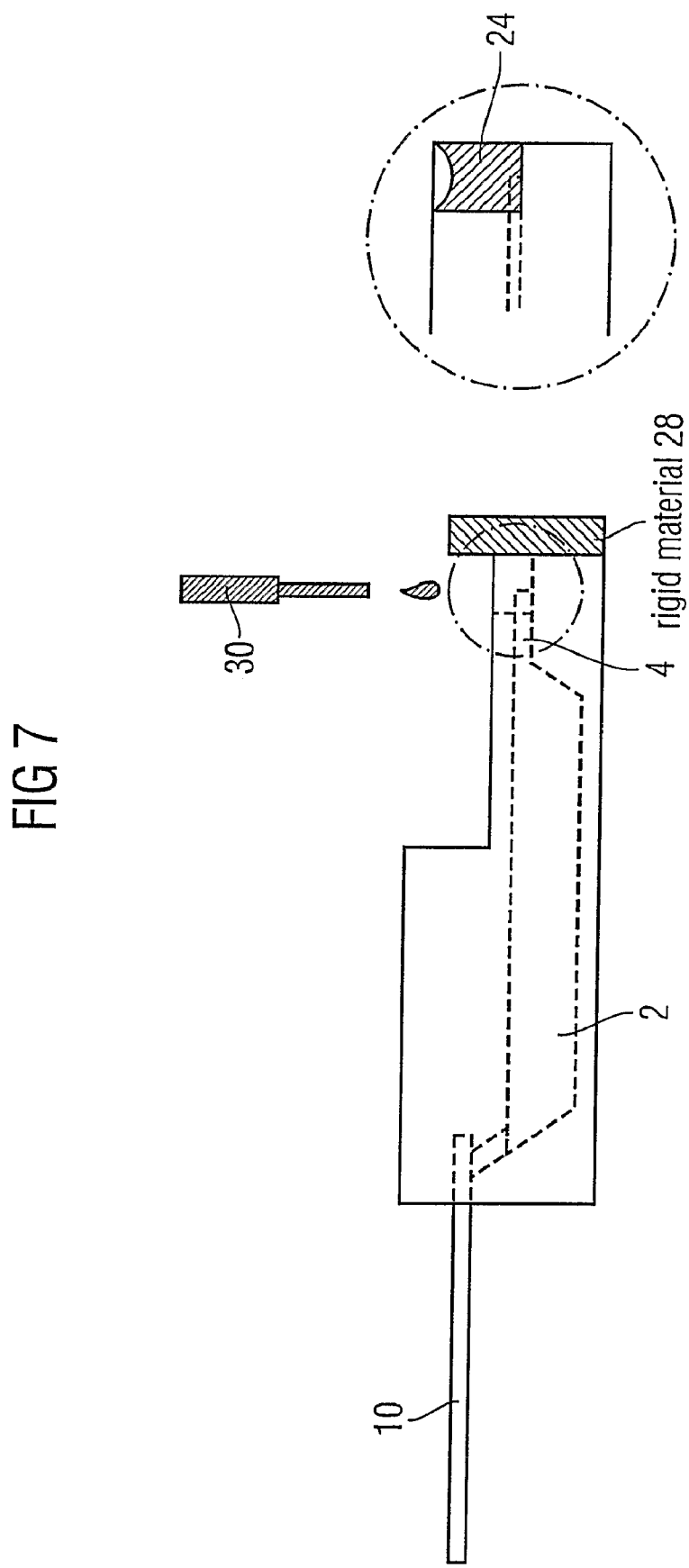

METHOD OF MANUFACTURE OF ENCAPSULATED PACKAGE

This application is a continuation of co-pending International Application No. PCT/SG2005/000368, filed Oct. 25, 2005, which designated the United States and was published in English, of which application is incorporated herein by reference.

TECHNICAL FIELD

The present invention relates to an improved method of manufacturing an encapsulated component package, such as an encapsulated semi-conductor package, and to an improved package made by such a method.

BACKGROUND

Conventional packages, such as the TO220 package, typically include a heat sink or other support on which the component or chip is mounted and a plurality of leads electrically connected to the heatsink. The component or chip, heat sink and one end of the leads are encapsulated in a molded body, usually formed of a resin material. One end of the heat sink is provided with legs that connect to a tie bar extending from the package. The legs and tie bar are used to support the components during encapsulation of the package. When the package has been formed, this extension piece can be removed from the package by pulling the tie bar with material encapsulating this which together form a tab. This ruptures the metal material to separate the tie bar from the completed package.

A problem with the known devices formed in this way is that when the legs are ruptured when the tie bar is broken from the formed package, the ends of the legs will be exposed within small holes extending from the end of the package. If the devices are used with high voltage applications, arcing can result from this exposed metal. Accordingly, the existence of the exposed metal means that the devices are limited to low voltage applications.

SUMMARY OF THE INVENTION

According to the present invention, the exposed ends of the metal legs of the heatsink are covered with an insulating material. In this way, the ends of the metal legs are not exposed, and therefore the risk of arcing is reduced. This means that the devices can be used for high voltage applications.

The insulating material may be introduced into the hole in the molded body of the device which includes the ruptured ends of the metal legs at the bottom. The material may be introduced into the hole by injecting this through an injection needle.

The position of the rupture of the legs may be unpredictable, and the profile of the exposed metal surface may be inconsistent. It may therefore be difficult to determine how much insulating material must be injected into the hole to fill this. Also, depending upon the profile of the end of the ruptured metal leg, this may interfere with an injection needle positioned within the hole to inject insulating material, or make it difficult to completely cover this with insulating material. Further, especially if the profile of the ruptured end of the leg is convex, there is a risk that voids will be created at the sides of the hole around the edge of the end of the legs. Accordingly, in one embodiment, it is preferred that the leg is formed with a weakened portion so that the leg ruptures at a known point and with a known shape. This means that the insulation over the exposed end of the leg may be more accurately formed.

In a preferred example of the present invention, the legs of the heat sink include curved, preferably crescent shaped, voids at the point where the legs are to rupture when the tie bar is pulled from the completed package. The curved voids in the legs cause a point of weakness, such that when the tie bar is pulled, the legs rupture at this point. In this way, the point at which the legs rupture, and therefore the point of exposed metal within the package is known. Accordingly, if a needle is used to inject material into the opening of the package containing the exposed ends of the ruptured legs to cover the exposed metal, it can be ensured that this does not extend into the opening to a point where it contacts with the exposed metal. Further, as the position at which the legs will rupture is known, it can be determined how much insulation must be injected into the opening to cover the exposed metal and fill the opening. This makes proper insulation of the exposed metal easier.

A further advantage of providing a curved void, preferably crescent shaped, in the legs is that the resulting profile of the exposed metal within the package will be curved. This helps ensure that when insulating material is introduced into the opening in the package, this is able to flow over the entire surface of the exposed material. In one example, the void may be such that the exposed material has a low point on one side of the opening in the package, and is concavely curved up towards the opposite side. Alternatively, the void can be arranged such that the surface of the exposed metal is concave, with the lowest point being between the two side edges. In either case, since the insulating material can flow along the concavely curved surface, there is no possibility of trapping air within voids to either side of the exposed metal as may be the case with conventional designs.

The curved, preferably crescent shaped, void may be an internal void formed within the leg but not extending through the leg. However, it is preferred that the void extends through the thickness of the leg.

Preferably the void in the leg is located close to the support so that the leg ruptures close to the support. This helps ensure that the exposed end of the leg is contained within the opening in the package and can be covered by the insulation introduced into the opening.

According to another embodiment of the present invention, the package can be encapsulated so that the opening containing the exposed metal at the end of the legs of the heat sink is open to at least two sides, for example, on the top and front, of the package. By exposing the end of the legs in this way, rather than merely by leaving the exposed end of the legs at the bottom of a normal hole shaped opening, it is easier to inject material into the opening to cover the exposed end of the legs.

In one example according to this aspect of the invention the package can be held at an angle, so that insulating material can be introduced into the opening from above at an angle to the sides of the package to which the opening opens. In another example, the package may be laid on its back, with insulating material dropped into the opening from the front. In this case, a barrier, preferably of a rigid material, may be provided to close one part of the opening to ensure that the insulating material remains within the opening.

It will be appreciated that both the first and second aspects of the invention may be used in combination.

The insulating material can be cured after filling the opening in the package, for example using ultra-violet radiation or by heat.

BRIEF DESCRIPTION OF THE DRAWINGS

The present invention will now be described by way of example with reference to the accompanying drawings, in which.

DETAILED DESCRIPTION OF ILLUSTRATIVE EMBODIMENTS

Figure 1A:
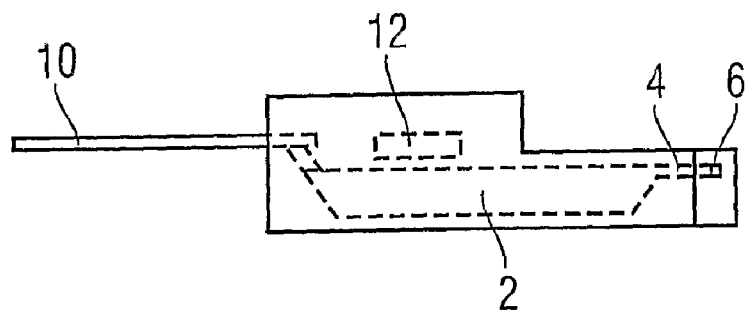
FIGS. 1a and 1b show a sectional side view and sectional front view of a known TO220 package.
Figure 1B:
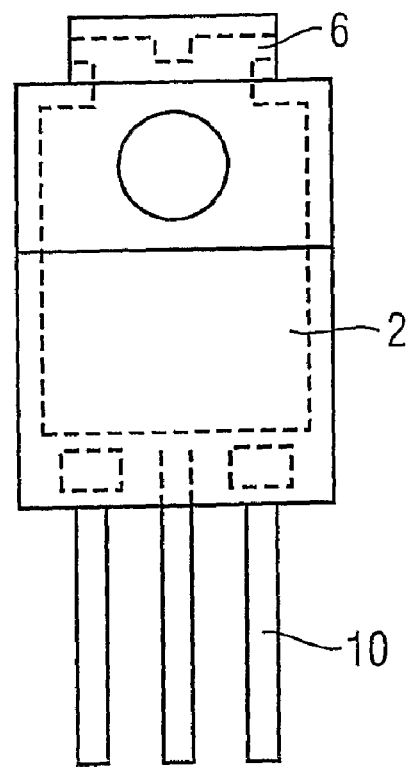

FIG. 1 shows a conventional TO220 package. From the cross-sectional view in FIG. 1a, the package comprises a heat sink 2 which supports a component or chip 12. The package also includes leads 10, one end of which extends outside the package for external connection, the other end being electrically connected to the component 12. The heat sink 2 includes legs 4 which extend beyond the perimeter of the finished, encapsulated, product. These legs 4 are used to support the heat sink 2 and component 12 during encapsulation. In use, the heat sink 2, component 12 and internal end of the leads 10 are provided in a mold cavity, and resin material is introduced into the mold cavity encapsulating the heat sink 2, component 12 and internal end of the leads 10. When the resin has set, the package can be removed from the mold cavity. The ends of the legs 4 distal from the heat sink 2 form a tie bar 6. The tie bar 6 is pulled from the package to rupture the legs 4.

Figure 2A:
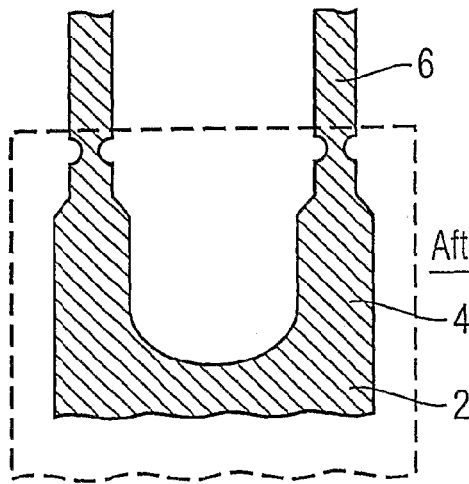
FIGS. 2a and 2b, collectively as FIG. 2, shows a conventional tie bar designed, both before and after the tie bar is removed.
Figure 2B:
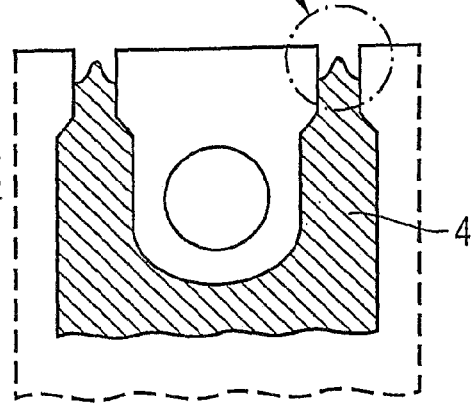

The rupture is intended to occur within the perimeter of the encapsulated body, leaving two small holes extending from the end of the encapsulated body leading to exposed metal at the end of the legs 4. This is best shown in FIG. 2. FIG. 2a shows a cross-section of the end of the encapsulated package including the legs 4 of the heat sink 2 and the extension of the legs forming the tie bar 6 prior to rupturing. FIG. 2b shows the same view when the tie bar 6 is pulled from the legs 4, causing these to fracture leaving exposed metal in the holes.

According to the present invention, insulating material is introduced into the hole to cover the exposed ends of the legs 4. The material may be injected into the hole through an injection needle, and ideally covers the entire exposed surface of the ends of the legs 4.

Figure 5A:
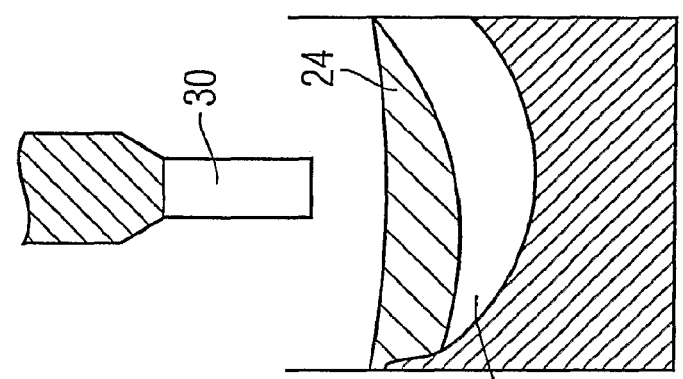
FIGS. 5a, 5b and 5c, collectively as FIG. 5, shows the filling of an opening in the package with insulation according to examples of the first aspect of the present invention.

There are some potential difficulties with the provision of an insulating material over the exposed ends of the ruptured legs 4. Firstly, if the material is injected into the hole using an injection needle 30, as the height of the exposed metal is unknown, there is a risk that the needle 30 will contact the exposed metal, thereby preventing the injection of material from the needle 30. There may also be a risk that as the material is injected into the opening, voids will be created on either side of the central peak of the exposed metal, which will be sealed by the insulating material, thereby preventing the insulating material completely covering the exposed metal surface. This is shown in the cross-sectional view of FIG. 5a. It will be seen that the generally convex end of the leg means that as insulating material is injected into the hole, there is the risk of creation of voids to either side of the exposed end of the leg. These voids may allow arcing if the devices used at high voltages.

Figure 3A:
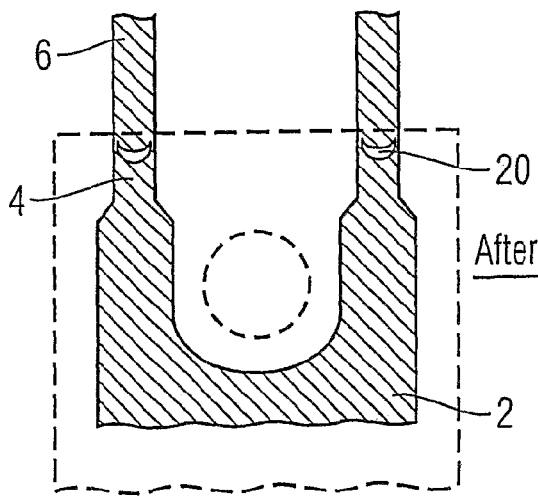
FIGS. 3a and 3b, collectively as FIG. 3, shows a package designed using a tie bar design according to the first aspect of the present invention.
Figure 3B:
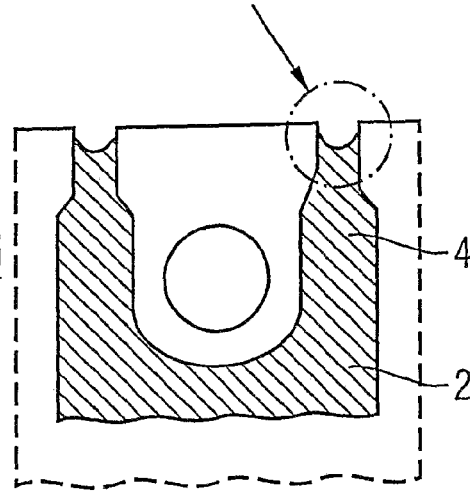

Accordingly, in a preferred example of the present invention, the legs 4 of the heat sink 2 are formed with a crescent shaped hole 20 that extend through the thickness of the legs 4, as shown in FIG. 3a. By providing the legs 4 with these crescent shaped holes 20, when the tie bar 6 is pulled from the legs 4 of the heat sink 2, the exposed end of the legs 4 will be formed with a concave recess. This is shown in FIG. 3b. This concave recess will be at a known height within the opening in the end of the encapsulated package. Accordingly, if a needle 30 is provided within the opening through which insulating material 24 (FIG. 5) is injected into the opening, it can be ensured that the needle 30 will not contact the exposed end of the material. Further, due to the concave shape of the exposed end of the legs 4, as material is injected into the opening, this will fully cover the exposed end of the legs 4, without any danger of leaving voids. Accordingly, the risk of arcing is avoided.

Figure 4A:
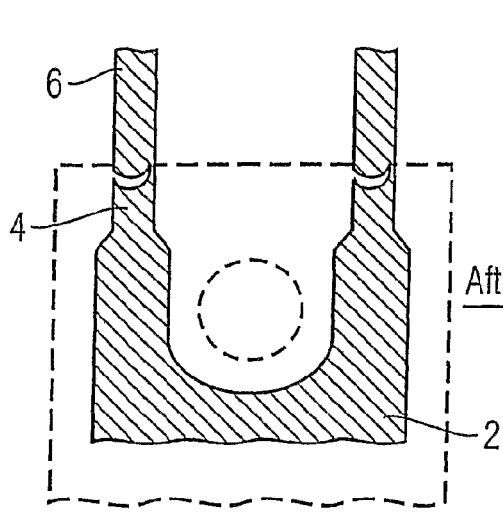
FIGS. 4a and 4b, collectively as FIG. 4, shows an alternative package designed using an alternative tie bar design according to the first aspect of the present invention.
Figure 4B:
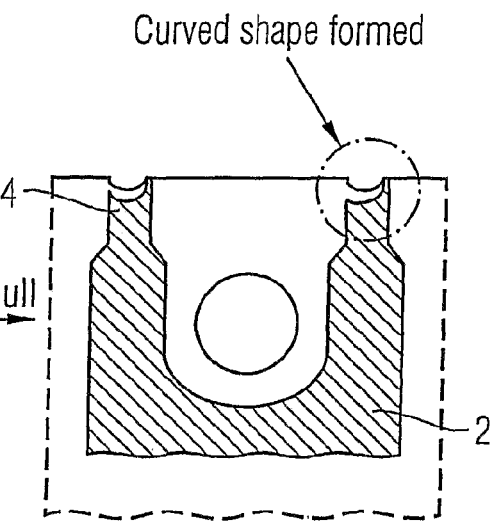

In the example shown in FIG. 3, the crescent shaped opening 20 is formed generally symmetrically across the leg 4 so that the profile of the exposed end of the legs 4 is a concave shape, with the lowest point around the middle of the leg, extending to a higher point on either side. According to an alternative example shown in FIG. 4, the crescent shaped opening extends from one side of the legs 4 towards, but not to, the other side. In this case, the resulting profile of the exposed end of the legs 4 is a concave profile, with one side being at the lowest point compared to the other side. FIG. 4a shows a cross-section of the end of the package when the tie bar 6 is connected to the legs 4. FIG. 4b shows the same view when the tie bar 6 is removed from the legs 4.

Figure 5B:
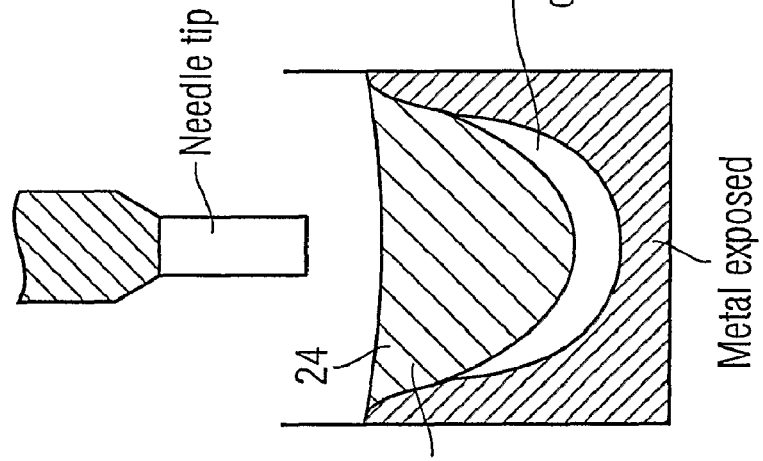
Figure 5C:
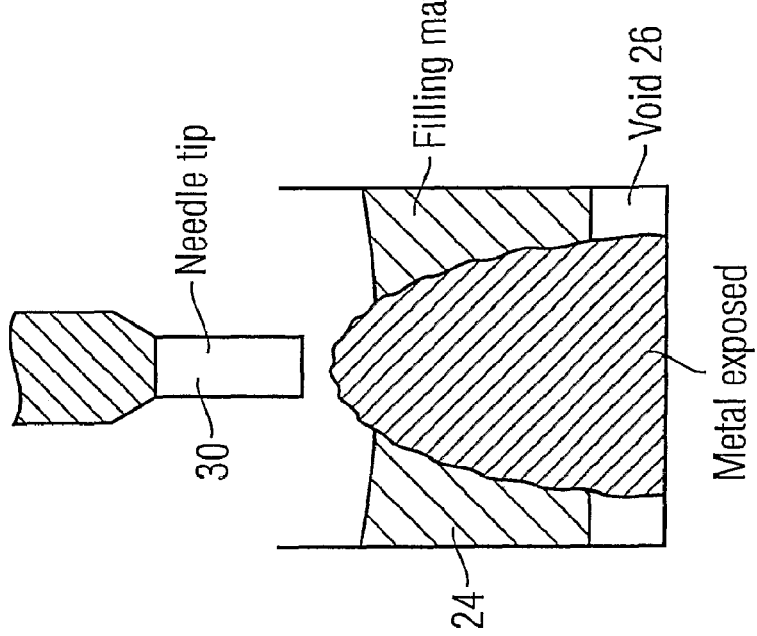

FIGS. 5b and 5c show cross-section views of the holes in the package and exposed ends of the legs 4 according to these preferred examples of the present invention. It will be seen that the concave ends of the legs 4 ensure that the insulating material fully covers the exposed ends.

Figure 6:
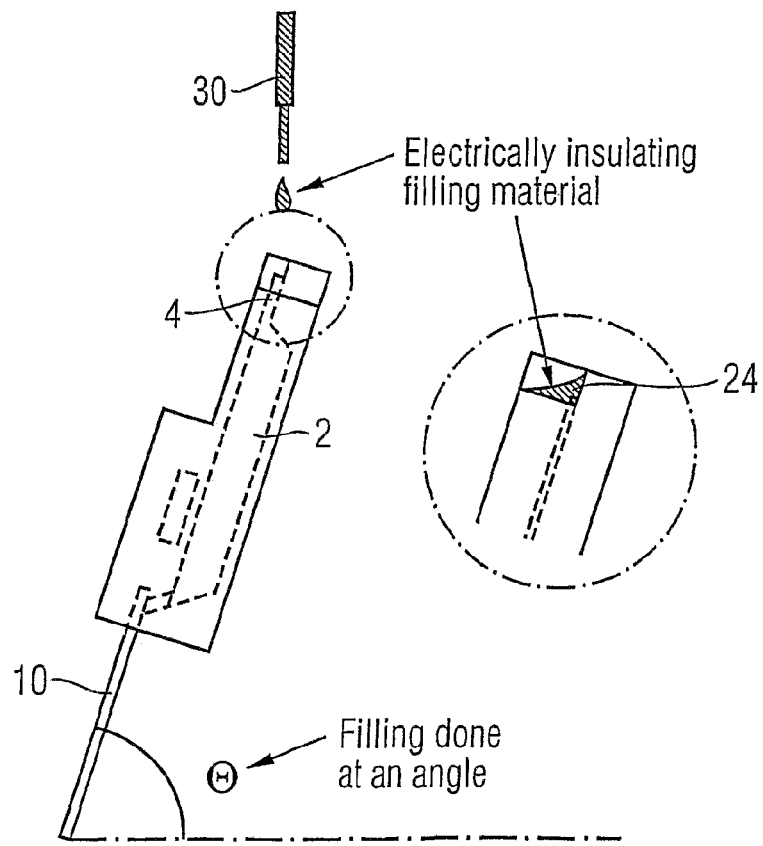
FIG. 6 shows an example of a method for filling an opening according to a first example of the second aspect of the present invention; and, FIG. 7 shows an alternative example of a method of filling an opening according to the second aspect of the present invention.

According to a further example of the present invention, shown best with respect to FIGS. 6 and 7, the openings in the end of the encapsulated package which include the exposed metal ends of the legs 4 of the heat sink 2 are formed as slots that open onto both the front and end surfaces of the package rather than being formed as holes extending only from one surface. This can be achieved by use of a suitable mold tool which prevents the encapsulating material filling the region around the leg 4 towards the front of the- package to retain the front opening of the package. By providing a slot rather than a hole, it is easier for insulating material to cover the exposed metal ends of the legs 4. As shown in FIG. 6, the package can be held at an angle to the horizontal and vertical, and electrically insulating material injected or dropped into the slot containing the exposed metal ends of the legs 4 from above and to the front of the package. The material will easily flow to the bottom of the slot, thereby covering the exposed ends of the legs 4. Alternatively, the package may be laid on its back, and the material injected or dropped through the front of the package to cover the exposed end of the legs. In this case, a rigid stop material 28 may be held over the end of the slot to prevent the material 24 from flowing out. When the material has set, the stop 28 may be removed. Although it may be considered that this arrangement is no different from a conventional arrangement in which the insulating material is dropped through a single opening, it will be appreciated that the opening is much larger than the relatively small opening through which material can be injected using a conventional manufacturing method. Accordingly, this assists with the flow of material into the opening and to cover the exposed end of the leg.

What is claimed is:

1. A method of making an encapsulated component package, the method comprising:
    providing a support for supporting components of the package during encapsulation, the support including legs extending beyond the perimeter of the final package;
    rupturing the support legs; and
    covering exposed ends of the legs with an insulating material.

2. The method according to claim 1, wherein the exposed ends of the legs are contained within an opening in the package.

3. The method according to claim 2, wherein covering the exposed ends comprises injecting the insulating material into the opening in the package to cover the ends of the legs.

4. The method according to claim 3, wherein injecting the insulating material comprises injecting the insulating material through a needle.

5. The method according to claim 1, wherein the legs each include a curved void, and wherein the support legs are ruptured at the curved void.

6. The method according to claim 5, wherein the curved void is provided between opposed sides of the legs.

7. The method according to claim 5, wherein the curved void extends from one side of the leg towards the other side of the leg.

8. The method according to claim 5, wherein the curved void extends through the legs.

9. The method according to claim 5, wherein the curved void is crescent shaped.

10. The method according to claim 1, wherein encapsulation is carried out to provide an elongated opening extending onto at least two sides of the package for containing the exposed ends of the legs after rupture of the legs.

11. The method according to claim 10, wherein the insulating material is introduced into the elongated opening at an angle not perpendicular to the at least two sides of the package onto which the elongated opening extends.

12. The method according to claim 10, wherein the package is orientated with the elongated opening generally vertically, and wherein the insulating material is deposited through the elongated opening.

13. The method according to claim 10, wherein the package is arranged with an elongated side of the elongated opening oriented generally vertically, and wherein the insulating material is deposited through an upper opening of the elongated opening.

14. The method according to claim 1, further comprising curing the insulating material after covering the exposed ends.

15. A package formed in accordance with the method of claim 1.

* * * * *